(12) United States Patent
Guzik et al.

(10) Patent No.: US 8,169,750 B1
(45) Date of Patent: May 1, 2012

(54) REMOVABLE NANOPOSITIONING CARTRIDGE FOR MAGNETIC HEAD AND DISK TESTERS

(75) Inventors: Nahum Guzik, Palo Alto, CA (US); Brice Arnold, Newark, CA (US); Forest Ray, Rewood City, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 13/047,540

(22) Filed: Mar. 14, 2011

Related U.S. Application Data

(63) Continuation of application No. 11/728,182, filed on Mar. 22, 2007, now abandoned.

(60) Provisional application No. 60/843,958, filed on Sep. 11, 2006.

(51) Int. Cl.
*G11B 5/56* (2006.01)
*G05B 11/18* (2006.01)
*G01R 33/12* (2006.01)

(52) U.S. Cl. ............... 360/294.4; 324/212; 318/593; 73/865.9

(58) Field of Classification Search ....... 360/294–294.4, 360/240, 292, 77.02, 77.04–77.08, 78.05, 360/78.12; 324/210–212; 318/592–594; 73/865.9

See application file for complete search history.

(56) References Cited

U.S. PATENT DOCUMENTS

| | | | | |
|---|---|---|---|---|
| 5,339,702 A | * | 8/1994 | Viches | 73/865.9 |
| 5,359,474 A | * | 10/1994 | Riederer | 360/78.05 |
| 5,808,435 A | * | 9/1998 | Mager | 318/593 |
| 5,903,085 A | * | 5/1999 | Karam | 310/328 |
| 6,242,910 B1 | * | 6/2001 | Guzik et al. | 324/212 |
| 6,930,850 B2 | * | 8/2005 | Takagi et al. | 360/77.03 |
| 7,034,372 B1 | * | 4/2006 | Kulangara et al. | 257/415 |
| 7,124,654 B1 | * | 10/2006 | Davies et al. | 73/866 |
| 7,509,224 B2 | * | 3/2009 | Holwell et al. | 702/108 |
| 7,532,006 B2 | * | 5/2009 | Guzik et al. | 324/210 |
| 7,542,868 B2 | * | 6/2009 | Herdendorf et al. | 702/150 |

FOREIGN PATENT DOCUMENTS

JP 07270305 A * 10/1995

* cited by examiner

*Primary Examiner* — Will J Klimowicz

(74) *Attorney, Agent, or Firm* — Pierce Atwood LLP; Joseph M. Maraia

(57) ABSTRACT

A removable cartridge for magnetic head and disk testers is disclosed. The removable cartridge includes: a base plate; a first end of an actuator rigidly fixed to the base plate; an HGA mounting block rigidly fixed to a second end of the actuator; a first end of a flexure rigidly coupled to the HGA mounting block; and a second end of the flexure rigidly coupled to the base plate.

6 Claims, 14 Drawing Sheets

REMOVABLE NANOPOSITIONING CARTRIDGE FOR MAGNETIC HEAD AND DISK TESTERS

CROSS REFERENCE TO OTHER APPLICATIONS

This application is a continuation of U.S. patent application Ser. No. 11/728,182, entitled REMOVABLE NANOPOSITIONING CARTRIDGE FOR MAGNETIC HEAD AND DISK TESTERS filed Mar. 22, 2007, now abandoned, which is incorporated herein by reference for all purposes, which claims priority to U.S. Provisional Application No. 60/843,958, entitled REMOVABLE NANOPOSITIONING CARTRIDGE filed Sep. 11, 2006, which is incorporated herein by reference for all purposes.

BACKGROUND OF THE INVENTION

Testing for magnetic storage media and heads requires a reference platform so that results can be compared between different storage media and different read/write heads. For example, media and heads should be interchangeable on the reference platform so that other elements that influence testing remain the same. These other elements can include elements such as rotation stability and tracking servo performance. Also, unwanted environmental noise, such as vibration, should be eliminated as an influencing factor so that measurements are repeatable and reliable. To address this, different heads are able to be mounted securely on a stable cartridge unit for the reference platform. Consistent electronic reading, writing, and servo performance is enabled by placing electronic components close to the mounted head on the cartridge unit that connect to the different heads. However, in order to dynamically keep the head over its track on the media, the stable cartridge unit, which is often quite massive with its head and electronics, needs to be precisely moved. This is increasingly difficult as magnetic storage technology requirements become more demanding, such as accommodating tracks closer together on the media and media turning at faster rates which require faster dynamic systems to keep the head over its track on the media. It would be beneficial to use a reference platform for testing of magnetic media and heads even for more demanding requirements such as faster dynamic systems to keep the head over closely spaced tracks on the media.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A removable cartridge is disclosed. The removable cartridge enables magnetic head and disk testing using different magnetic heads. An actuator is mounted on the removable cartridge. The actuator moves a magnetic head to different locations or radii over an optical media. The actuator moves a much smaller mass than the entire removable cartridge and so can be moved at a higher mechanical bandwidth than the entire removable cartridge.

Figure 1:
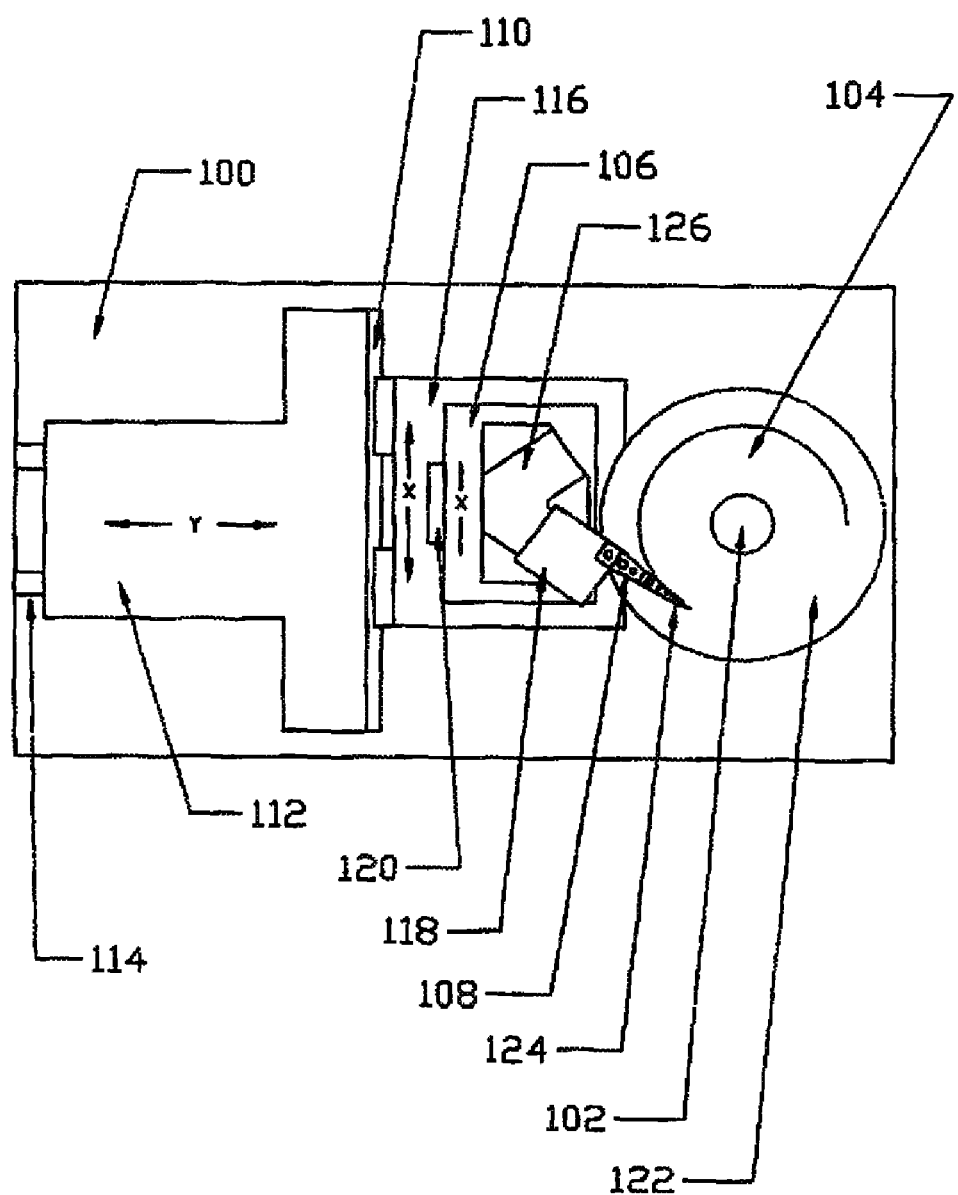
FIG. 1 is a block diagram illustrating an embodiment of a spinstand for a magnetic head and disk tester.

FIG. 1 is a block diagram illustrating an embodiment of a spinstand for a magnetic head and disk tester. A magnetic head and disk tester is an instrument that is typically used for testing the characteristics of magnetic heads and disks. Testers may include a mechanical and an electrical component. The mechanical component, also referred to herein as a spinstand, moves the head with respect to the disk. The electronic component is responsible for measurement, calculation, and analysis of the signals to and from the head. In the example shown, a spinstand includes base 100, rotary spindle 102 for mounting media 104, Y coarse positioning stage 112 that moves in the Y direction, and X coarse positioning stage 116 that moves in the X direction. X coarse positioning stage 116 is coupled to Y coarse positioning stage 112 by linear bearing 110. Y coarse positioning stage 112 is coupled to the base by linear bearing 114. X Precision stage 106, moving in the X direction, is mounted to the X coarse positioning stage 116. X precision stage 106 is comprised of a piezo-electric actuator and a parallelogram flexure. Displacement sensor 120 (e.g., a linear glass scale mounted to the parallelogram and optical reader mounted to X coarse positioning stage 116) provides position feedback for X precision stage 106. In some embodiments, the X coarse positioning stage 116 and Y coarse positioning stage 112 have a travel range of 10 centimeters and an accuracy of several microns, and X precision stage 106 has a travel range of 30 microns and an accuracy of several nanometers.

The spinstand also includes removable cartridge 118, which attaches to mounting platform 126 that is rigidly coupled to precision stage 106. Head gimbal assembly 108 (also referred to herein as an HGA 108) mounts on the cartridge. Read/write head 124 is a part of the HGA 108. To move read/write head 124, X precision stage 106 moves cartridge 118 and mounting platform 126, which in some cases has a combined mass that exceeds 500 grams. This large mass results in slow movement and a low mechanical bandwidth.

Servo positioning tracks, represented in FIG. 1 by 122, can be written to media 104 using X precision stage 106 to move read/write head 124. Feedback from displacement sensor 120 is used to position read/write head 124 while writing servo positioning tracks. The movement speed of X precision stage 106 is low due to its large mass, but the accuracy of movement is sufficient to write servo positioning tracks. After a servo positioning track has been created, the signal from read/write head 124 can be used directly for position feedback without the use of external position sensors.

Figure 2:
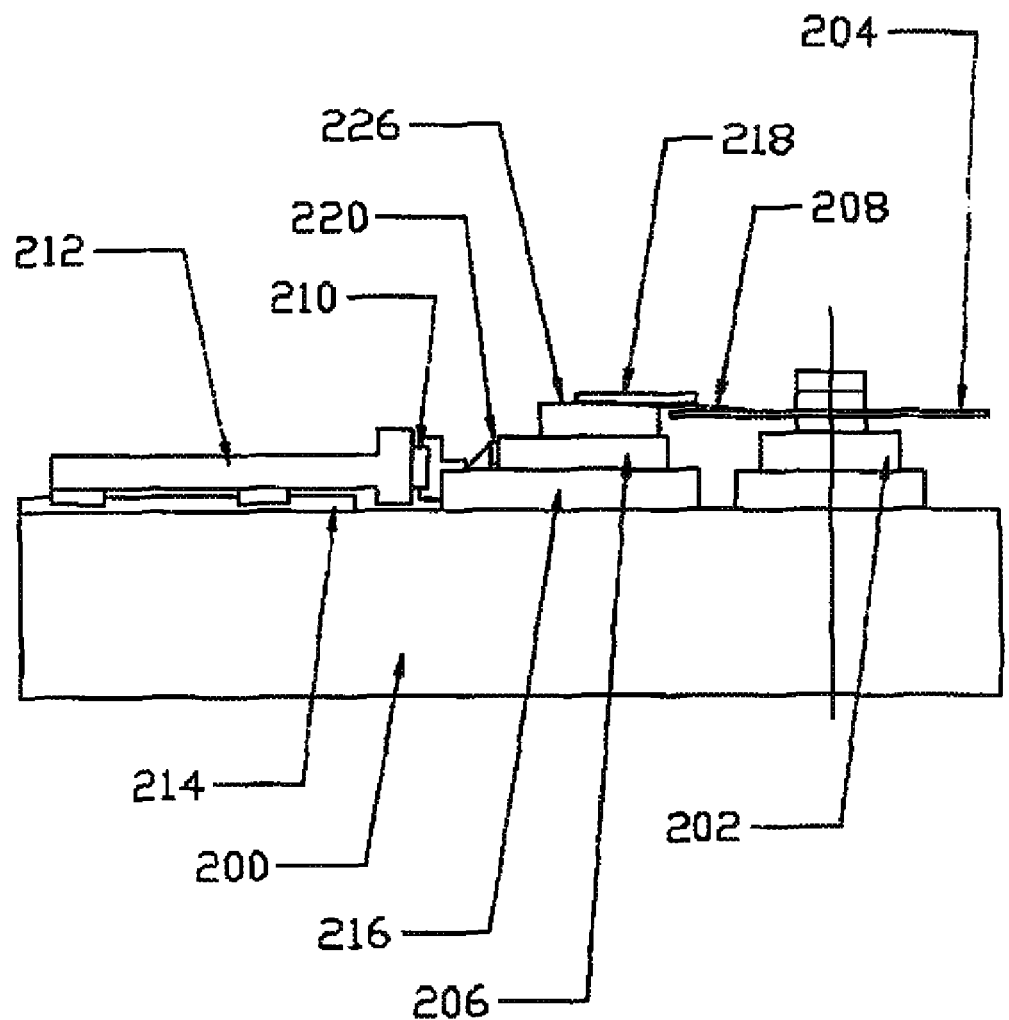
FIG. 2 is a block diagram illustrating an embodiment of a side elevation of a spinstand.

FIG. 2 is a block diagram illustrating an embodiment of a side elevation of a spinstand. In some embodiments, the spinstand of FIG. 2 is the same as the spinstand of FIG. 1. In the example shown, HGA 208 is attached to removable cartridge 218. Removable cartridge 218 is coupled to mounting platform 226, which is fixed to X precision stage 206. Displacement sensor 220 measures the movement of X precision stage 206. X coarse positioning stage 216 is coupled to Y coarse positioning stage 212 by linear bearing 210. The Y coarse positioning stage is coupled to base 200 by linear bearing 214. Spindle 202 is coupled to base 200 and holds magnetic media 204. HGA 208 is positioned over magnetic media 204 using X coarse positioning stage 216 and Y coarse positioning stage 212 and positioned over servo positioning tracks on magnetic media 204 using X precision stage 206.

One measurement of the performance of a spinstand is the positioning error, or the error between the actual position of a read/write head over a magnetic media and the prescribed position (e.g., the center of a servo positioning track). The faster a spinstand can accurately move the read/write head (characterized by mechanical bandwidth), typically the better it can compensate for positioning errors. One way to continue to improve positioning accuracy is a higher mechanical bandwidth. Reducing the mass that is moved along with the read/write head is one way to increase mechanical bandwidth.

A method of lowering the moving mass coupled to a read/write head is to add an actuator directly to a HGA. Using this method, the actuator moves the read/write head directly. Although this reduces the moving mass, it generally requires that the actuator be designed as a part of the HGA. In practice this approach is limited by the stroke of the actuator, which is small (a few microns), and the fact that it cannot be used to test an HGA that is not built with an actuator. One way to make a test system universal to all HGA designs is to attach the HGA to a spinstand using a removable mounting device referred to as a cartridge.

Figure 3:
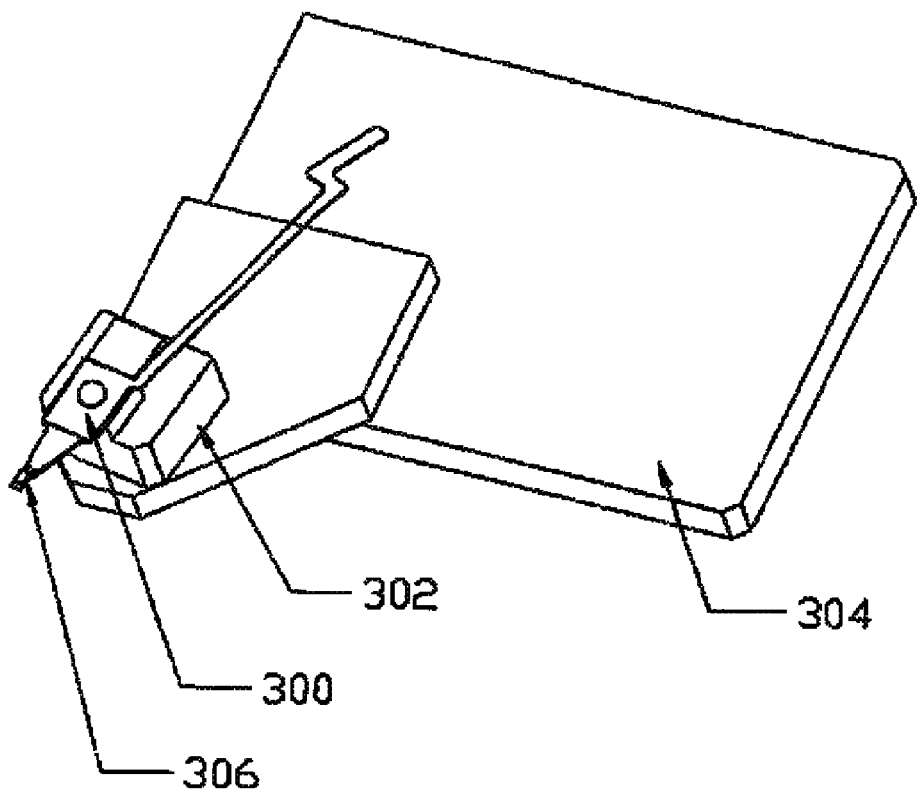
FIG. 3 is a block diagram illustrating an embodiment of a removable cartridge.

FIG. 3 is a block diagram illustrating an embodiment of a removable cartridge. In the example shown, a removable cartridge includes base 304 and mounting block 302. Mounting block 302 is rigidly fixed to base 304. HGA 300 attaches to mounting block 302. Read/write head 306 is part of HGA 300. HGA 300 is removable from mounting block 302. Mounting block 302 is designed such that HGA 300 is quickly installed and removed from the removable cartridge without special tools or alignment procedures. The removable cartridge is adapted to fit different HGA 300 designs by varying the location and height of mounting block 302 on base 304. One disadvantage of this removable cartridge is that the entire cartridge, and the platform that couples it rigidly to a precision stage of a spinstand, must be moved in order to move read/write head 306 over a magnetic media. This results in a mechanical bandwidth that is limited by the combined mass of these components.

Figure 4:
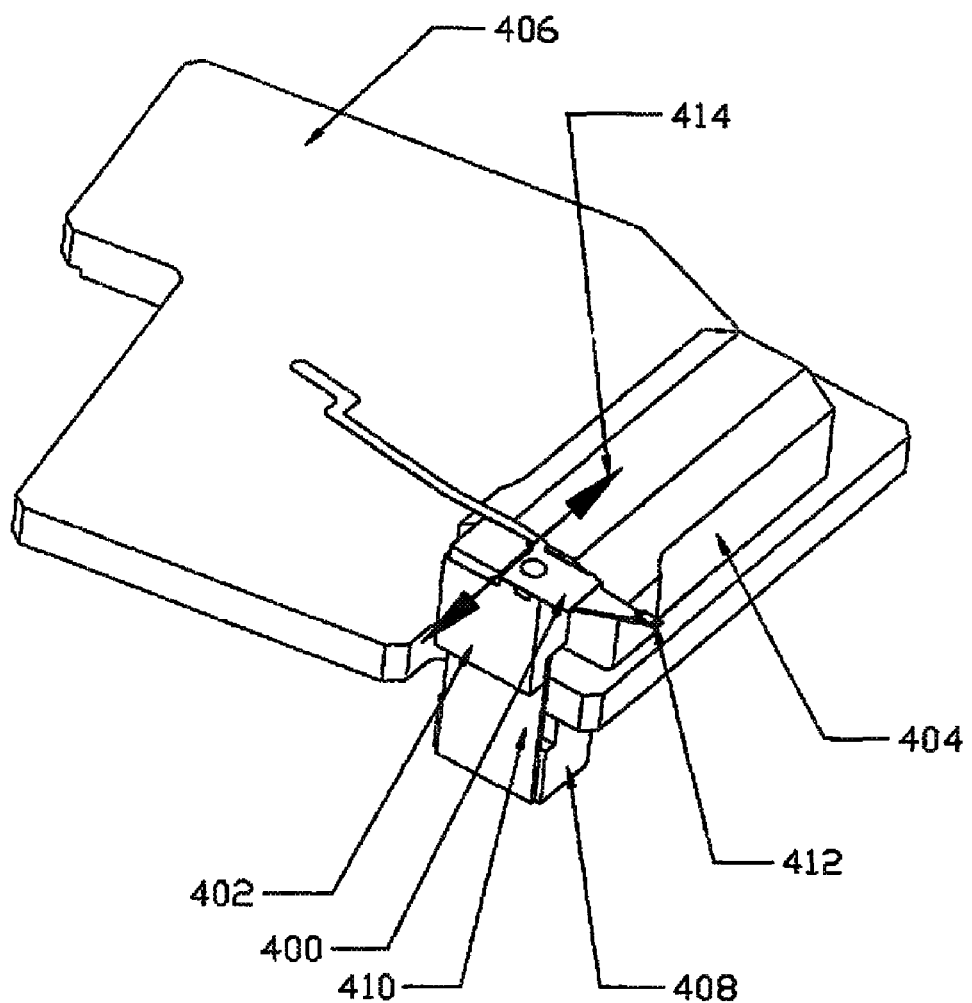
FIG. 4 is a block diagram illustrating an embodiment of a removable nanopositioning cartridge.

FIG. 4 is a block diagram illustrating an embodiment of a removable nanopositioning cartridge. In the example shown, the removable nanopositioning cartridge includes cartridge base 406, piezo actuator 404 that is rigidly coupled to base 406, mounting block 402 that is rigidly coupled to piezo actuator 404, and flexure 410 that couples mounting block 402 to cartridge base 406. HGA 400 attaches to mounting block 402. Arrow 414 shows the direction of mounting block 402 movement. The removable nanopositioning cartridge attaches to a mounting platform on a spinstand (not shown), and is removable and interchangeable with other cartridges.

Because mounting block 402 is rigidly fixed to piezo actuator 404, forces exerted on mounting block 402 from general handling of the removable nanopositioning cartridge and from installing and removing HGA 400 will be transmitted directly to piezo actuator 404 if mounting block 402 is not additionally supported. In some embodiments, mounting block 402 is supported using flexure 410 coupled to cartridge base 406. In some embodiments, such as for use in a production environment, piezo actuator 404 is isolated from external forces.

The removable nanopositioning cartridge of FIG. 4 includes piezo actuator 404 that moves only HGA 400 and mounting block 402. This is a significantly less mass than is moved when an actuator is required to move a removable cartridge such as is shown in FIG. 3. In some embodiments, the mass of HGA 400 and mounting block 402 does not exceed 5 grams. In some embodiments piezo actuator 404 has sufficient travel (e.g., exceeding 10 microns) to move a read/write head over a servo positioning track on a magnetic media. Therefore, the mechanical bandwidth of the nanopositioning cartridge is higher than a cartridge without a piezo-actuator.

In some embodiments, the removable nanopositioning cartridge can be easily manufactured, produced in quantity, and be durable in a production environment.

In some embodiments, a method used to control the position of the actuator is as follows: to control the actuator, a servo track written on the media and read by the read/write head is used for position feedback. Power and control signals are sent to the actuator using a moving circuit board with pogo-pin type connectors. This board is mounted on the spinstand, and after engagement connects to another circuit board on the cartridge. Retracting the moving board turns off power to the actuator before the cartridge is removed. The board on the cartridge also contains memory that stores mechanical resonance information specific to the cartridge. Multiple cartridges can be used on the same spinstand, each with its own control parameters. In some embodiments, a displacement sensor mounted to the cartridge is not required. In some embodiments, a displacement sensor is used.

Figure 5:
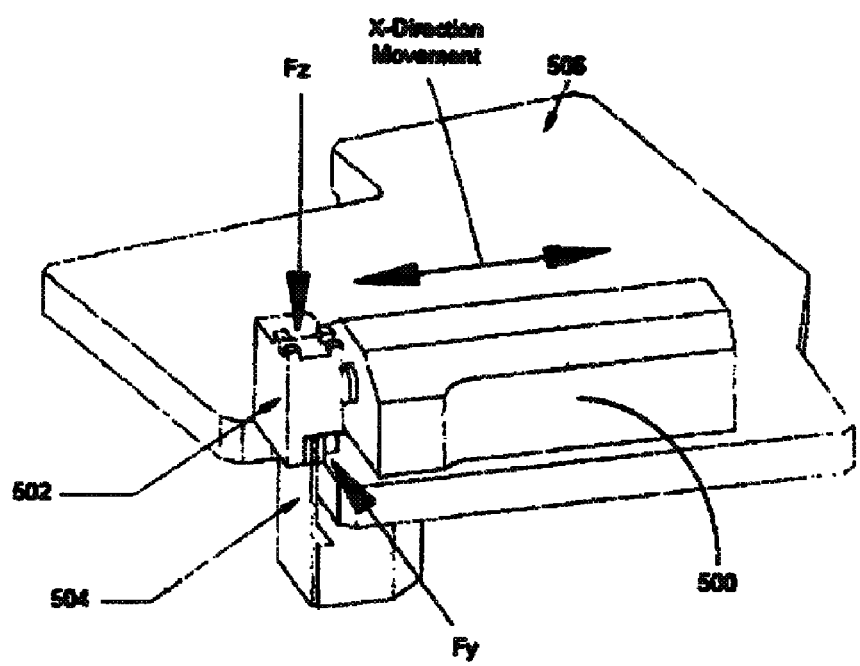
FIG. 5 is a block diagram illustrating an embodiment of a removable nanopositioning cartridge.

FIG. 5 is a block diagram illustrating an embodiment of a removable nanopositioning cartridge. In the example shown, actuator 500 is sensitive to forces Fy and Fz. Forces in the X-direction of movement are not damaging. Mounting block 502 is coupled to cartridge 506 using a single blade flexure 504, which allows movement only in the X direction. The flexure is rigid in the Y and Z directions, so external forces Fy and Fz are transferred from mounting block 502 to cartridge 506 through flexure 504. This prevents damaging stress in the actuator. One reason to use the example single blade flexure is that it is low in mass and simple to assemble. In some embodiments, a parallelogram flexure is used.

Figure 6:
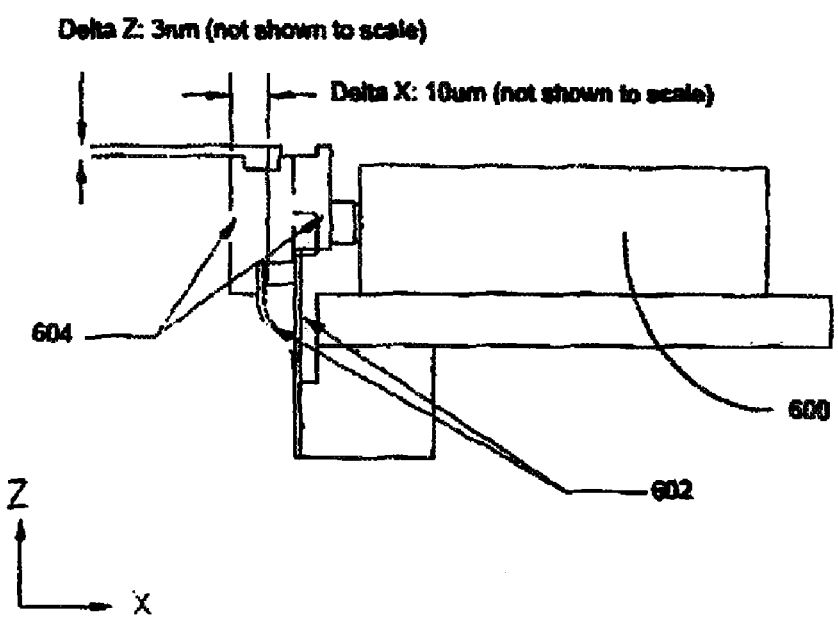
FIG. 6 is a block diagram illustrating an embodiment of exaggerated movement of a single blade flexure.

FIG. 6 is a block diagram illustrating an embodiment of exaggerated movement of a single blade flexure. In the example shown, because the length of flexure 602 is fixed, the height of mounting block 604 changes in the Z direction as actuator 600 moves in the X direction. To minimize the change in height Delta Z, flexure 602 is long compared to the stroke Delta X of actuator 600. In some embodiments, when the actual stroke Delta X is around 10 microns and the length of flexure 602 is around 10 millimeters, the resulting height change in Z of mounting block 604 is only 0.003 microns (3 nanometers). Because this height change is small, it does not effect testing and does not create damaging stress in actuator 600.

Figure 7:
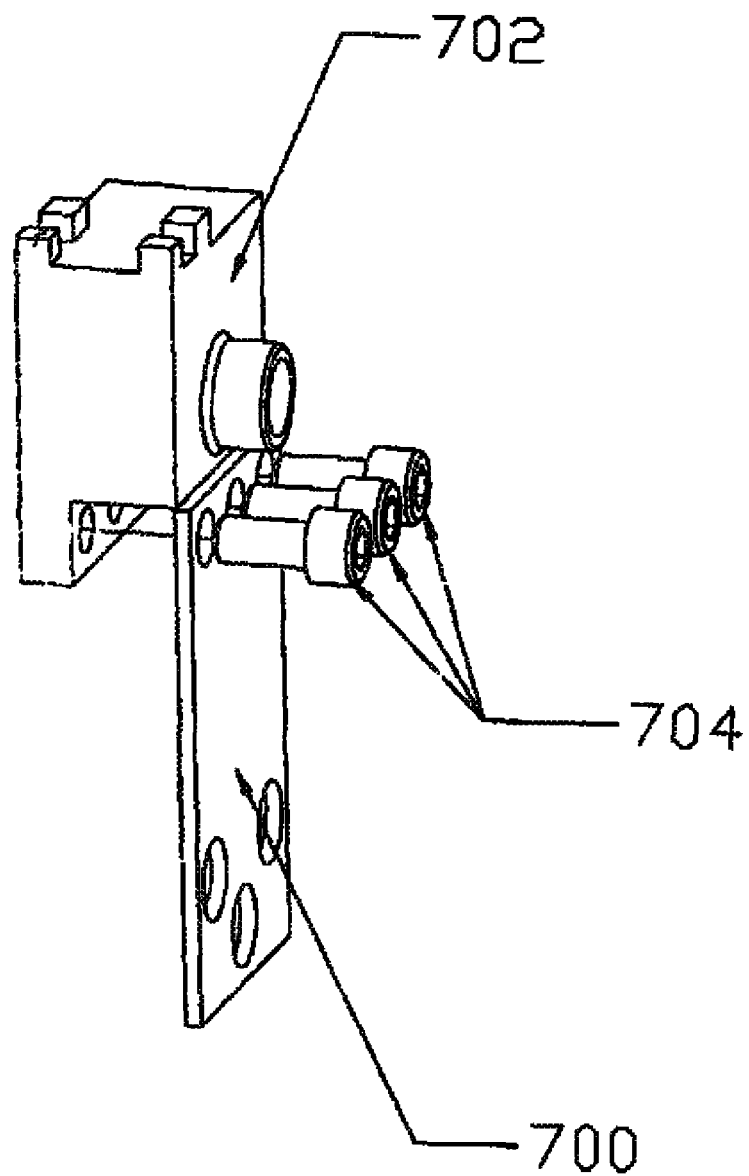
FIG. 7 is a block diagram illustrating an embodiment of steps in an assembly process for a nanopositioning removable cartridge.

FIG. 7 is a block diagram illustrating an embodiment of steps in an assembly process for a nanopositioning removable cartridge. The cartridge assembly process protects an actuator from damage by eliminating stresses. In the example shown, flexure 700 is first coupled to mounting block 702 using one or more screws 704 (e.g., three screws as shown in FIG. 7).

Figure 8:
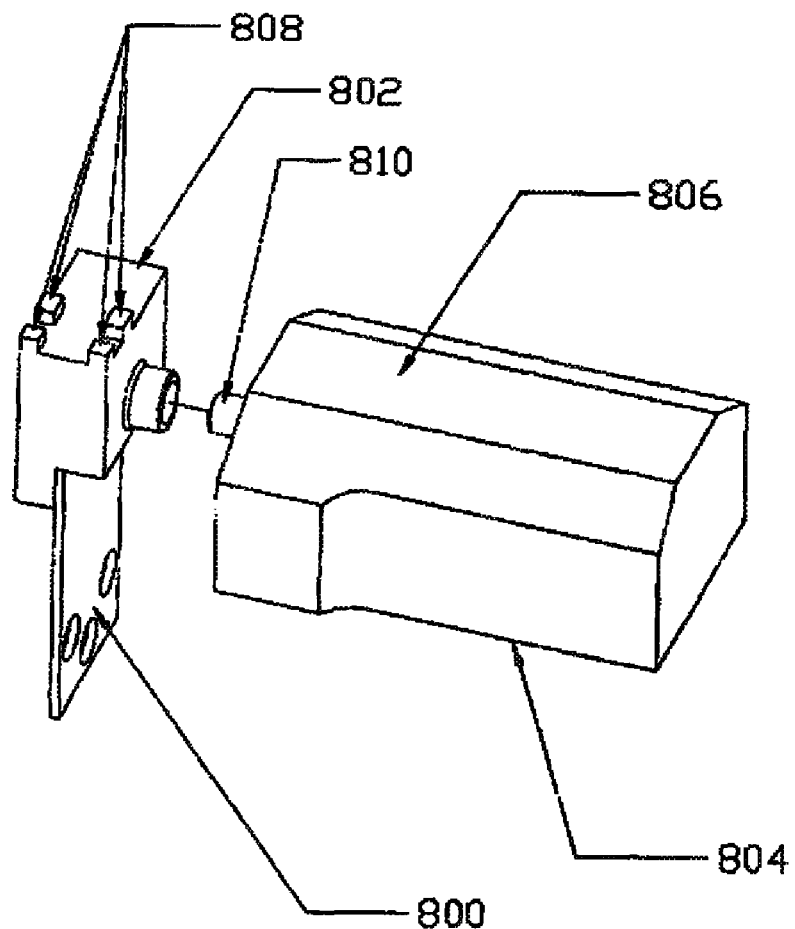
FIG. 8 is a block diagram illustrating an embodiment of steps in an assembly process for a nanopositioning removable cartridge.

FIG. 8 is a block diagram illustrating an embodiment of steps in an assembly process for a nanopositioning removable cartridge. In some embodiments, the steps of assembly of FIG. 8 are performed after the steps of FIG. 7. In the example shown, mounting block 802 is fixed to actuator 806 using a liquid adhesive. Both HGA mounting surfaces 808 and actuator surface 804 are kept parallel to the base of the cartridge by an assembly fixture while the adhesive cures. Actuator shaft 810 is fully engaged with mounting block 802 while the adhesive cures. Because mounting block 802 is not constrained in the radial direction relative to the shaft during this process (i.e., perpendicular to the actuator shaft axis or movement direction of the actuator shaft), there is no stress on the actuator shaft due to radial misalignment.

Figure 9:
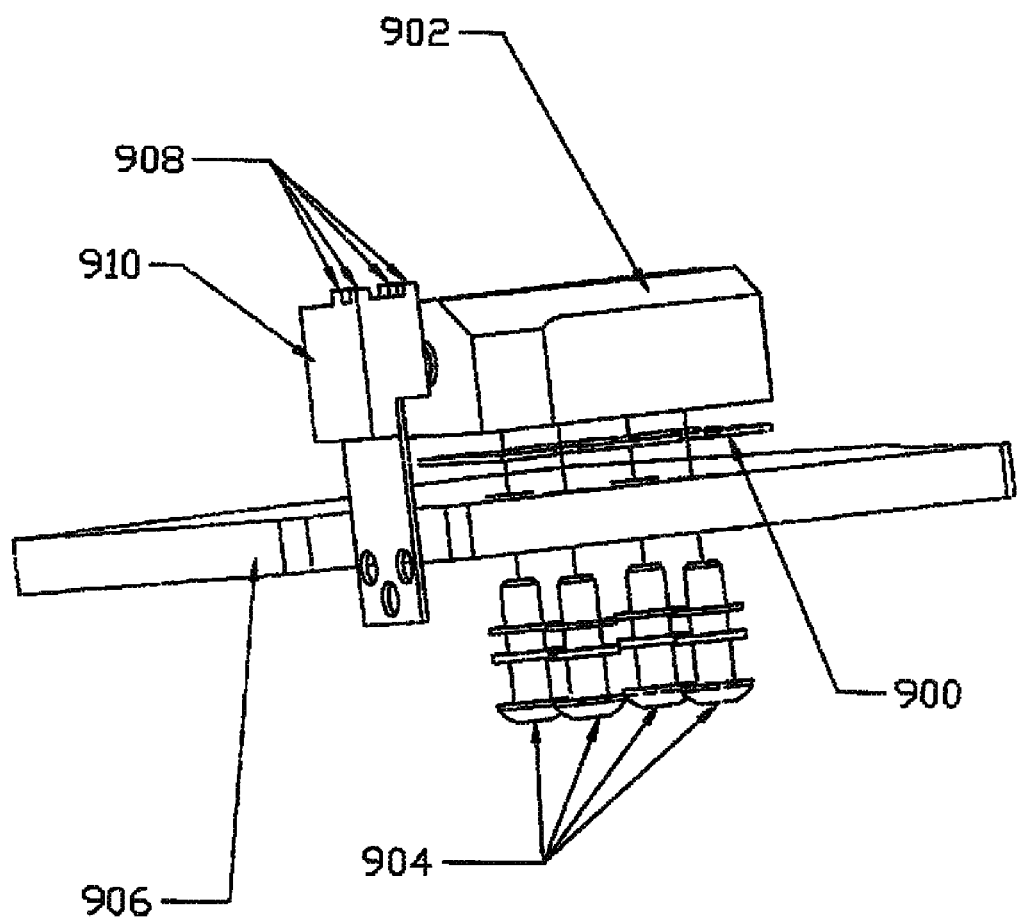
FIG. 9 is a block diagram illustrating an embodiment of steps in an assembly process for a nanopositioning removable cartridge.

FIG. 9 is a block diagram illustrating an embodiment of steps in an assembly process for a nanopositioning removable cartridge. In some embodiments, the steps of assembly of FIG. 9 are performed after the steps of FIG. 8. In the example shown, actuator 902 and mounting block 910 are attached to cartridge 906. The height of HGA mounting surfaces 908 on mounting block 910 are set using one or more shims 900 between actuator 902 and cartridge 906. Mounting block 910 and actuator 902 are manually aligned on the cartridge base before being fixed in place. An optical comparator is used during alignment to verify that the components are in the correct position. Actuator 902 is fixed in place using one or more screws 904 (e.g., four screws as shown in FIG. 9). The same actuator can be used with different HGA designs by changing the height of shims 900 and the location of actuator 902 on cartridge 906.

Figure 10:
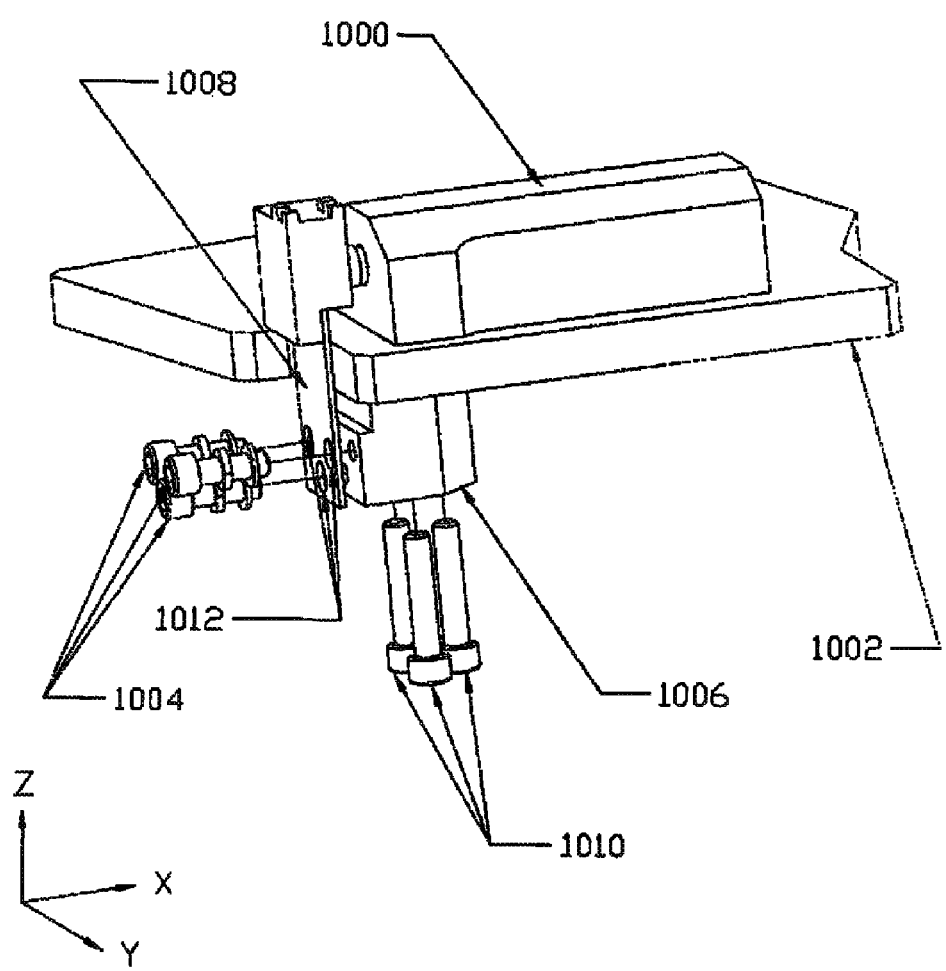
FIG. 10 is a block diagram illustrating an embodiment of steps in an assembly process for a nanopositioning removable cartridge.

FIG. 10 is a block diagram illustrating an embodiment of steps in an assembly process for a nanopositioning removable cartridge. In some embodiments, the steps of assembly of FIG. 10 are performed after the steps of FIG. 9. In the example shown, to provide rigidity for mounting block and to prevent actuator 1000 from being damaged after alignment, flexure 1008 is fixed to cartridge 1002 using flexure block 1006. Flexure block 1006 is aligned with the face of flexure 1008 while the base of flexure block 1006 is held against cartridge 1002. Screws 1010 are lightly tightened to hold flexure block 1006 in place. This allows the block to move in the X and Y directions, but not in the Z direction. Actuator 1000 determines the Z location of flexure 1008, and cartridge 1002 determines the Z location of the flexure block 1006. Flexure block 1006 and flexure 1008 are then connected with three or more screws 1004 (e.g., three screws as shown in FIG. 10). As three or more screws 1004 are tightened, flexure block 1006 is aligned and fixed to flexure 1008 in the X and Y directions. Over-sized holes 1012 in flexure 1008 account for any misalignment of flexure block 1006 and flexure 1008 in the Z direction, since neither can move in Z.

Figure 11:
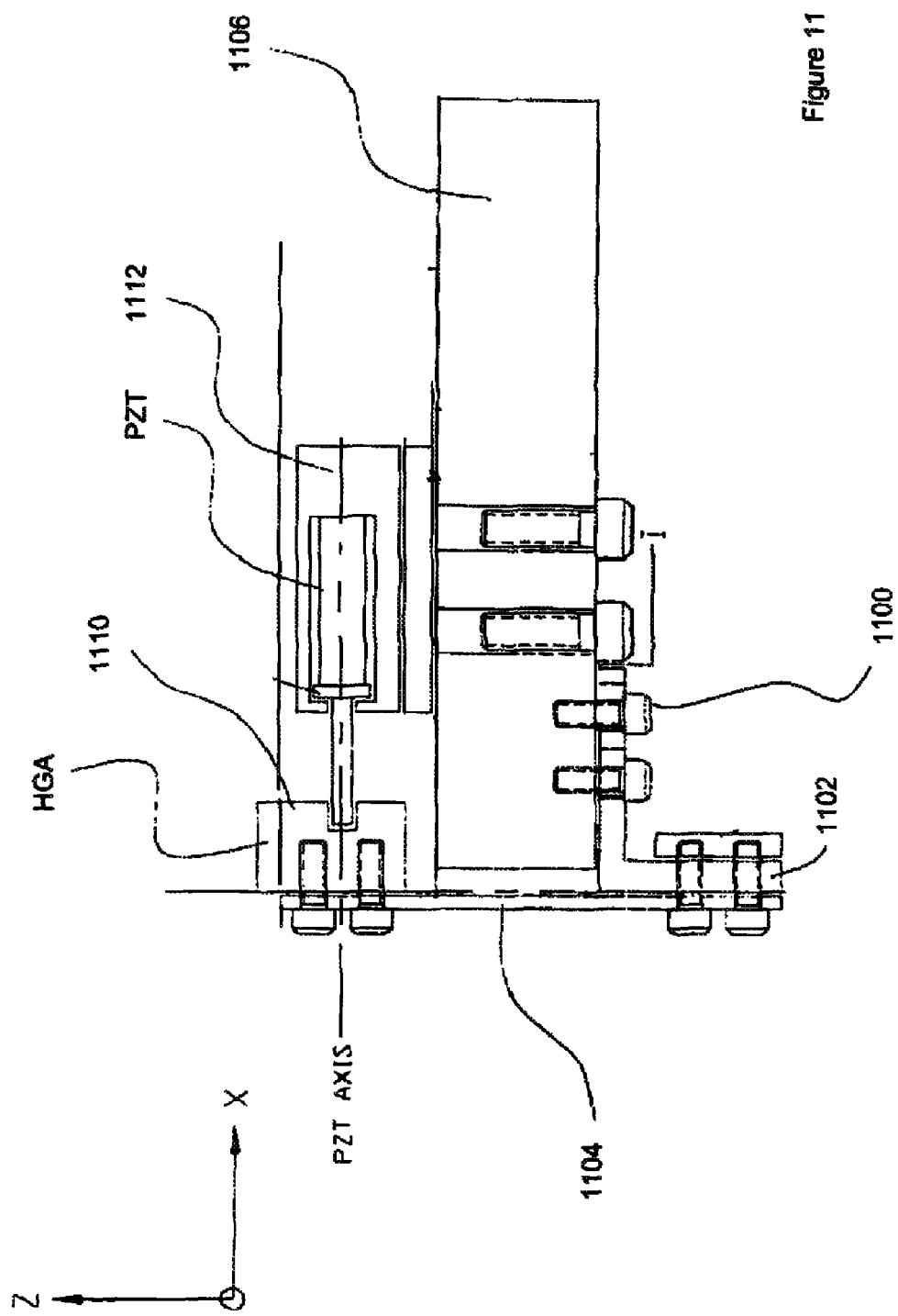
FIG. 11 is a block diagram illustrating an embodiment of steps in an assembly process for a nanopositioning removable cartridge.

FIG. 11 is a block diagram illustrating an embodiment of steps in an assembly process for a nanopositioning removable cartridge. In the example shown, flexure block 1102 is finally rigidly fixed to cartridge 1106 by tightening one or more screws 1100. Screws are used, in this case, to fix flexure block 1102 so that the flexure 1104 does not move during tightening. Because flexure 1104 does not move, no forces are transmitted to actuator 1112.

Actuator 1112 is damped externally to reduce resonances by coupling a viscoelastic dampening material to mounting block 1110. A mass is coupled to the dampening material. A preload force is applied to the mass using a compressed spring. The force is transmitted through a lever, which pivots about a pin. A spring maintains a constant pressure on the viscoelastic dampening material regardless of dimensional changes to the viscoelastic damping material.

Airflow created by a spinning magnetic media may create vibrations in flex portion of HGA. The vibrations are transmitted to the read/write head and potentially reduce positioning accuracy. To isolate the flex portion of the HGA from external airflow, a cover may be used. The cover reduces vibration and does not interfere with installation and removal of the HGA.

Figure 12:
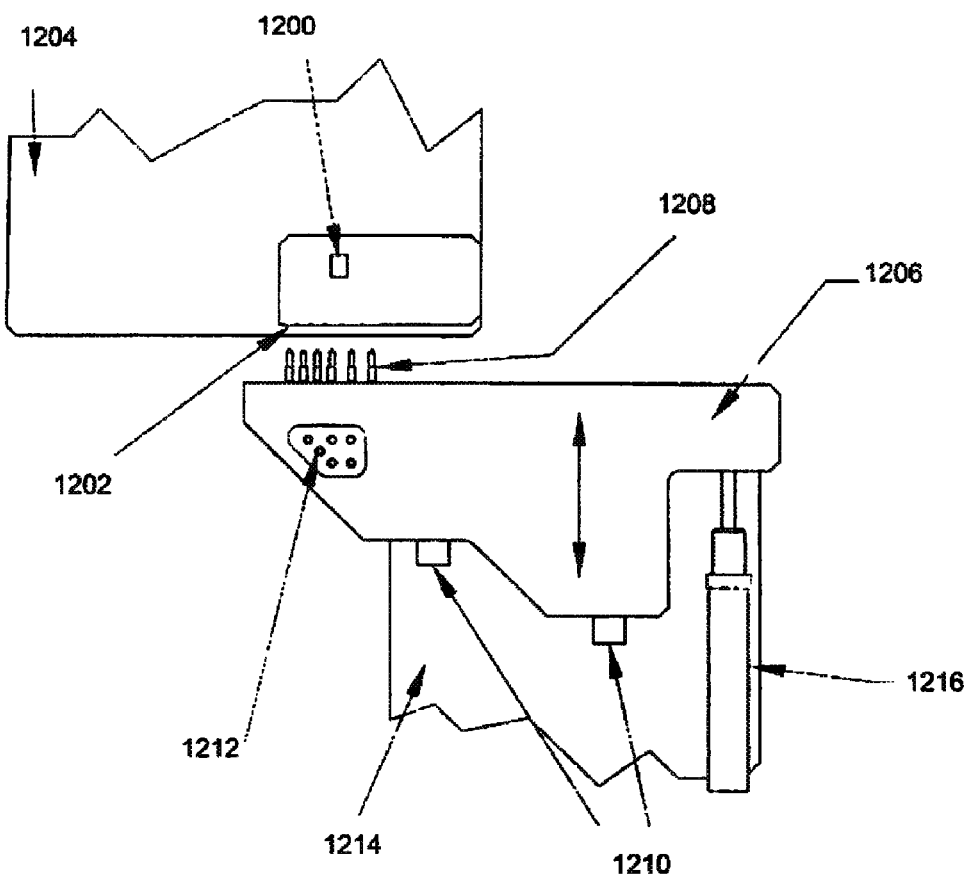
FIG. 12 is a block diagram illustrating an embodiment of steps in an assembly process for a nanopositioning removable cartridge.

FIG. 12 is a block diagram illustrating an embodiment of steps in an assembly process for a nanopositioning removable cartridge. In some embodiments, the steps of assembly of FIG. 12 are performed after the steps of FIG. 11. In the example shown, memory board 1200 is affixed to cartridge 1204. Specific mechanical resonance information and control parameters for the cartridge are stored in memory board 1200 and the information and parameters are used when compensating for these resonances using a closed-loop control system. Multiple cartridges with different parameters can be used interchangeably on one spinstand.

Memory board 1200 is connected to the spinstand electronics through moving circuit board 1206. Moving circuit board 1206 is coupled to mounting plate 1214 using two linear bearings 1210. Mounting plate 1214 is fixed to a mounting platform of a spinstand (e.g., mounting platform 126 of FIG. 1). Electrical power and signals are carried to pins 1208 by a set of wires 1212. The electrical signals include a control voltage for the cartridge actuator and data transmission to and from memory board 1200. After cartridge 1204 is installed on a spinstand, moving circuit board 1206 moves towards cartridge 1204. Pins 1208 on moving circuit board 1206 contact pads 1202 on memory board 1200. Moving circuit board 1206 retracts to allow cartridge 1204 to be removed and to disconnect power from the actuator. Movement of moving circuit board 1206 is controlled using pneumatic actuator 1216.

Figure 13:
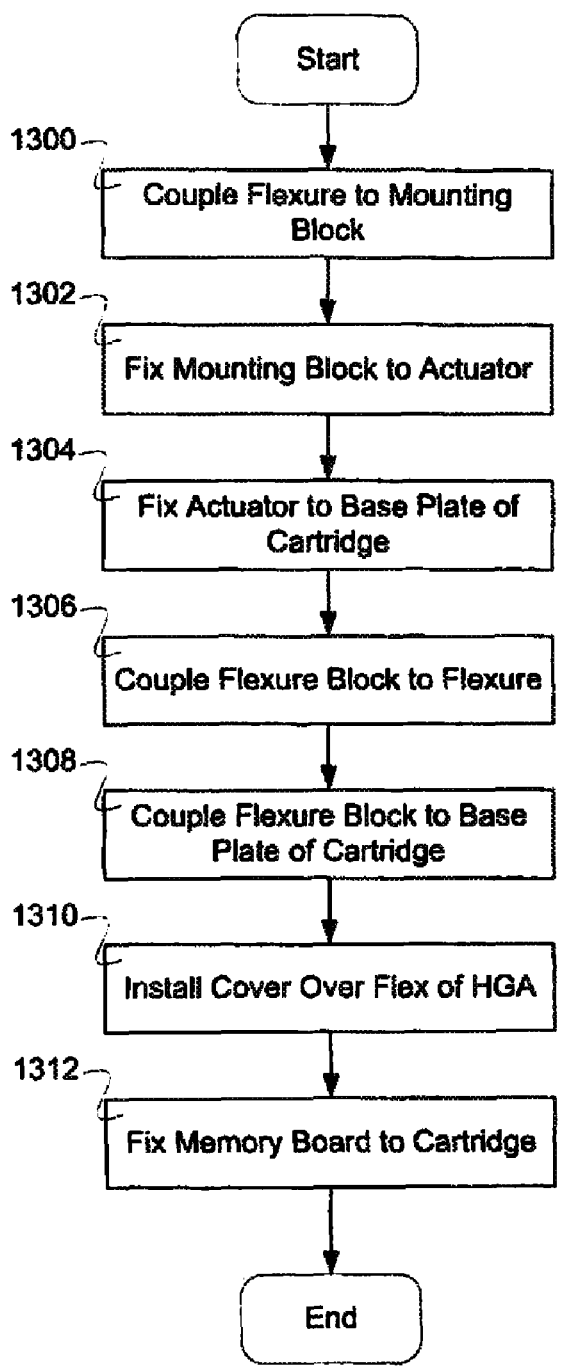
FIG. 13 is a flow diagram illustrating an embodiment of a process for assembling a removable nanopositioning cartridge.

FIG. 13 is a flow diagram illustrating an embodiment of a process for assembling a removable nanopositioning cartridge. In some embodiments, the process of FIG. 13 corresponds to the process steps as in FIGS. 7 through 12. In the example shown, in 1300 a flexure is coupled to a mounting block. In some embodiments, the flexure is coupled to the mounting block using one or more screws. In 1302, the mounting block is fixed to an actuator. In some embodiment, the mounting block is fixed to the actuator using a liquid adhesive that is rigid when cured. The mounting block is free to move axially relative to the actuator while the liquid adhesive fixing the mounting block to the actuator is curing. In 1304, fix the actuator to a base plate of the cartridge. In some embodiments, the actuator is fixed using screws, manually aligned with an optical comparator, and shimmed to the proper height by placing shims between the actuator and the base plate of the cartridge. In 1306, a flexure block is fixed to the flexure. In some embodiments, the face of the flexure block is aligned with the flexure and at the same time the flexure block is placed against the base plate of the cartridge. The flexure block is fixed to the flexure using screws. In 1308, the flexure block is fixed to the base plate of the cartridge. In some embodiments, the flexure block is fixed to the flexure using screws. A damper is mounted on the cartridge. The damper is attached to a pivoting arm and a preloaded spring such that a constant force is applied to the mounting block against the actuator shaft. In 1310, a cover is installed over flex portion of HGA. The cover isolates the flex portion of the HGA from air currents created by a spinning magnetic media. In 1312, fix memory board to cartridge. The memory board stores cartridge dependent mechanical resonance information as well as control parameters. The memory board is coupled electrically to a moving board that is attached to a platform of a spinstand via linear bearings.

Figure 14:
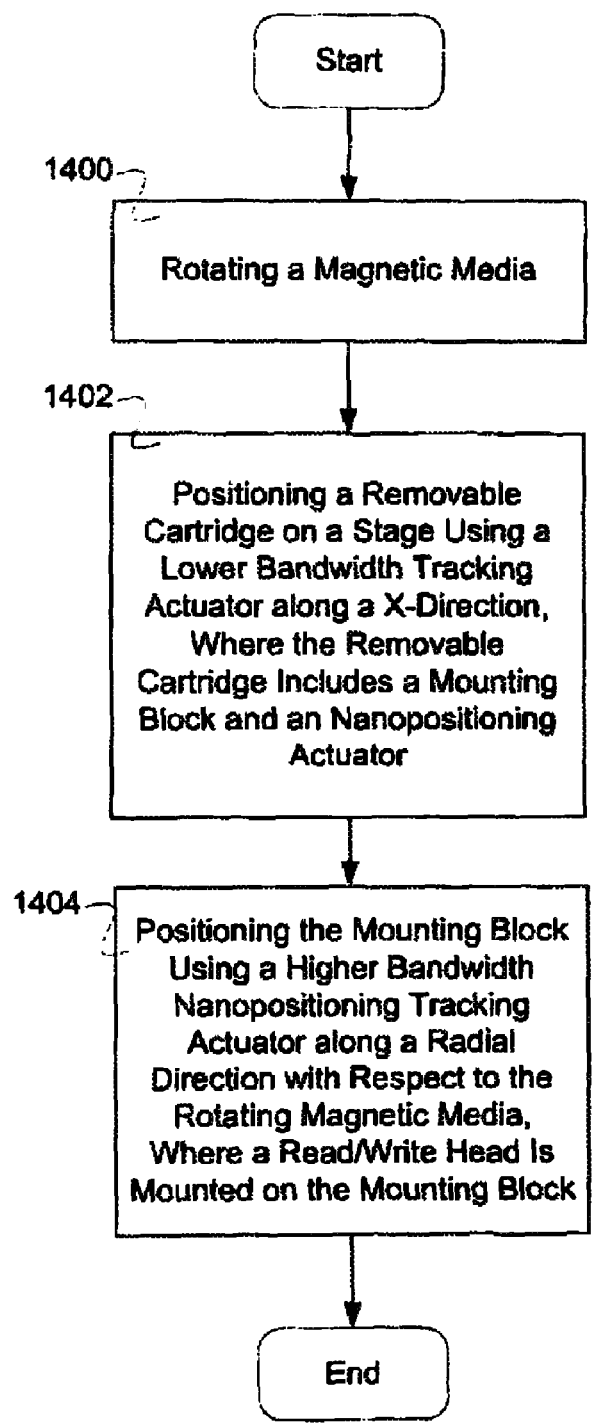
FIG. 14 is a flow diagram illustrating an embodiment of a process for testing for magnetic heads and media.

FIG. 14 is a flow diagram illustrating an embodiment of a process for testing for magnetic heads and media. In some embodiments, the process of FIG. 14 is used to test either a magnetic head and/or a magnetic media on a spinstand such as in FIG. 1. In the example shown, in 1400 a magnetic media is rotated. In 1402, a removable cartridge on a stage (e.g., a X coarse positioning stage or a X precision stage as in FIG. 1) is positioned using a lower bandwidth tracking actuator along a X-direction (e.g., a radial direction with respect to the rotating magnetic media), wherein the cartridge includes a mounting block and a high bandwidth nanopositioning actuator. In various embodiments, the lower bandwidth tracking actuator comprises a piezoelectric actuator, a damped piezoelectric actuator, a visco-elastically damped piezoelectric actuator, a preloaded damped piezoelectric actuator, a fine pitch lead screw actuator, or any other appropriate actuator. In some embodiments, a memory storing resonance information for controlling the high bandwidth nanopositioning actuator is included on the cartridge. The cartridge position is controlled using a closed loop control system where the error signal used for the control loop indicates deviation from the center position of the higher bandwidth actuator. In some embodiments, the error signal used for the control loop is based at least in part on the position of the read/write head over the servo positioning track on the rotating magnetic media. In some embodiments, the error signal is not based on the deviation from the center position of the higher bandwidth nonpositioning actuator.

In 1404, the mounting block is positioned using a higher bandwidth nanopositioning actuator along the X-direction (e.g., the radial direction with respect to the rotating magnetic media), where a read/write head is mounted on the mounting block. In various embodiments, the higher bandwidth nanopositioning actuator comprises a piezoelectric actuator, a damped piezoelectric actuator, a visco-elastically damped piezoelectric actuator, a preloaded damped piezoelectric actuator, or any other appropriate actuator. The mounting block is also attached to the cartridge using a flexure. In various embodiments, the mounting block is mounted directly on the actuator and guided to move in the X direction using a single blade flexure that is able to move in one-dimension, rails, grooves, interlocking fittings on the mounting block and cartridge, or any other appropriate manner of guiding the movement of the mounting block. A closed loop control system is used to control the position of the mounting block using the higher bandwidth nanopositioning actuator. The error signal for the closed loop control system measures deviation off of a servo positioning track on the magnetic media. The control loop is designed to keep a read/write head over a track on the magnetic media, where a track contains information written by the read/write head on the magnetic media. The information in the track comprises magnetic domains that have an overall alignment of their magnetic signature in a particular direction (e.g., dipoles are pointed in one direction either vertically or horizontally with respect to the surface of the magnetic media disk). The domains aligned in a particular direction can be detected or read by the read/write head.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A test cartridge, comprising:
A, a head mounting block, wherein the head mounting block has a gimbal support surface for a magnetic head gimbal assembly to be mounted for read or write testing;
B, a cartridge base having a planar actuator support surface on one side thereof;
C, a piezo actuator affixed to the actuator support surface, wherein the piezo actuator includes a drive end which is able to move along a displacement axis in response to an applied signal, and wherein the displacement axis is parallel to the actuator support surface of the cartridge base, and
D, a blade flexure, wherein the blade flexure includes
(i) a first end rigidly attached to the cartridge base along a first axis parallel to the actuator support surface and perpendicular to the displacement axis, and
(ii) a second end rigidly attached to the head mounting block along a second axis substantially parallel to the first axis,
wherein the blade flexure is relatively long in a direction extending between the first end and the second end and is relatively short in a direction transverse thereto, and
whereby the mounting block is disposed along the displacement axis and is in communication with the drive end of the piezo actuator, and
whereby the drive end of the piezo actuator is able to move the head mounting block and the gimbal support surface in the direction of the displacement axis in response to an applied signal while maintaining the first axis and the second axis to be substantially parallel.

2. A test cartridge as in claim 1, wherein the actuator includes an actuator mounting surface that is parallel to a reference plane, wherein the displacement axis is parallel to the reference plane.

3. A test cartridge as in claim 2, wherein the head mounting block includes a head mounting surface, and wherein the head mounting surface includes mount for the magnetic head gimbal assembly.

4. A test cartridge as in claim 2, wherein the head mounting block includes a flexure mounting surface, wherein the flexure mounting surface traverses the displacement axis, and wherein the flexure mounting surface is used to mount the flexure to the head mounting block.

5. A test cartridge as in claim 2, wherein the actuator includes an actuator mounting surface that is parallel to the reference plane, wherein the actuator mounting surface is used to mount the actuator to the cartridge base.

6. A test cartridge as in claim 5, wherein a shim is used between the actuator mounting surface and the cartridge base to adjust position only along a z axis with respect to the reference plane.

* * * * *